United States Patent [19]

Ramspacher et al.

[11] Patent Number: 4,672,732
[45] Date of Patent: Jun. 16, 1987

[54] METHOD OF FIXEDLY ATTACHING A COMPONENT TO A BASE MEMBER

[75] Inventors: Robert J. Ramspacher, Indianapolis; Charles Butcher, Carmel, both of Ind.

[73] Assignee: RCA Corporation, Princeton, N.J.

[21] Appl. No.: 833,927

[22] Filed: Feb. 27, 1986

[51] Int. Cl.⁴ .................. B21D 39/03; B23P 11/00
[52] U.S. Cl. ........................ 29/429; 29/450; 29/453; 29/526 R; 29/464; 403/12
[58] Field of Search .......... 29/429, 430, 526 R, 29/453, 464, 45.0; 403/12; 285/23, 24; 277/9, 9.5; 137/316

[56] References Cited

U.S. PATENT DOCUMENTS

| | | | |
|---|---|---|---|
| 1,435,887 | 11/1922 | Anderson | 277/9.5 X |
| 2,135,118 | 11/1938 | Stewart | 29/453 UX |
| 2,797,448 | 7/1957 | Revell et al. | 29/453 UX |
| 2,945,715 | 7/1960 | Burrell | 29/453 UX |
| 3,154,281 | 10/1964 | Frank | 29/453 X |
| 3,291,495 | 12/1966 | Liebig | 29/453 UX |
| 3,745,736 | 7/1973 | Fischer et al. | 29/453 UX |
| 3,908,942 | 9/1975 | Keith et al. | 403/12 X |
| 4,221,039 | 9/1980 | Smith | 29/453 X |
| 4,358,874 | 11/1982 | Kaiser | 403/12 X |
| 4,411,331 | 10/1983 | Hanada | 403/12 X |

Primary Examiner—Charlie T. Moon
Attorney, Agent, or Firm—Paul J. Rasmussen; Eric P. Herrmann; Dilip A. Kulkarni

[57] ABSTRACT

Integrally-molded with a plastic TV cabinet is a collapsible holding member. When a PCB is mounted on the TV cabinet at an assembly station, the collapsible holding member squeezes through an aperture in the PCB to temporarily secure the PCB to the TV cabinet. The partially-installed product is then moved to a screw driving station, where the PCB is permanently screwed to the TV cabinet.

2 Claims, 4 Drawing Figures

METHOD OF FIXEDLY ATTACHING A COMPONENT TO A BASE MEMBER

This invention relates to automatic assembly of electronic components.

BACKGROUND

Typically, an automatic instrument line for television (TV) receivers includes a plurality of work stations. The TV sets are transported on individual pallets, which ride on a pair of parallel tracks. The pallets stop at each work station for a short time (e.g., 10 seconds), so that work can be performed on the product. At the end of each cycle, the product is advanced to the next station, and so on.

The short cycle time is generally not sufficient to carry out all the operations required for accomplishing a given task. For example, it is difficult to position a printed circuit board (PCB) on the TV cabinet or a chassis and screw it in place, all in 10 seconds. Furthermore, it is desirable to avoid performance of more than one operation at a single station. Therefore, the PCB is positioned on the TV cabinet at one station, the pallet carrying the partially-installed PCB and the cabinet are advanced to the next station, and then the PCB is fixedly screwed to the cabinet.

A problem with the above arrangement is that a partially-installed PCB may become misaligned or fall off the TV cabinet as the pallet carrying the product is advanced to the next station. In either case, the assembly operations are interrupted.

SUMMARY OF INVENTION

In accordance with this invention, the television cabinet is provided with a collapsible retaining member. As a component (e.g., PCB) is mounted on the cabinet, the collapsible retaining member squeezes through an aperture in the component and then expands to temporarily secure the component to the TV cabinet. The product is then advanced to the next station, where the component is permanently attached to the cabinet.

IN THE DRAWINGS

DETAILED DESCRIPTION

Figure 1:
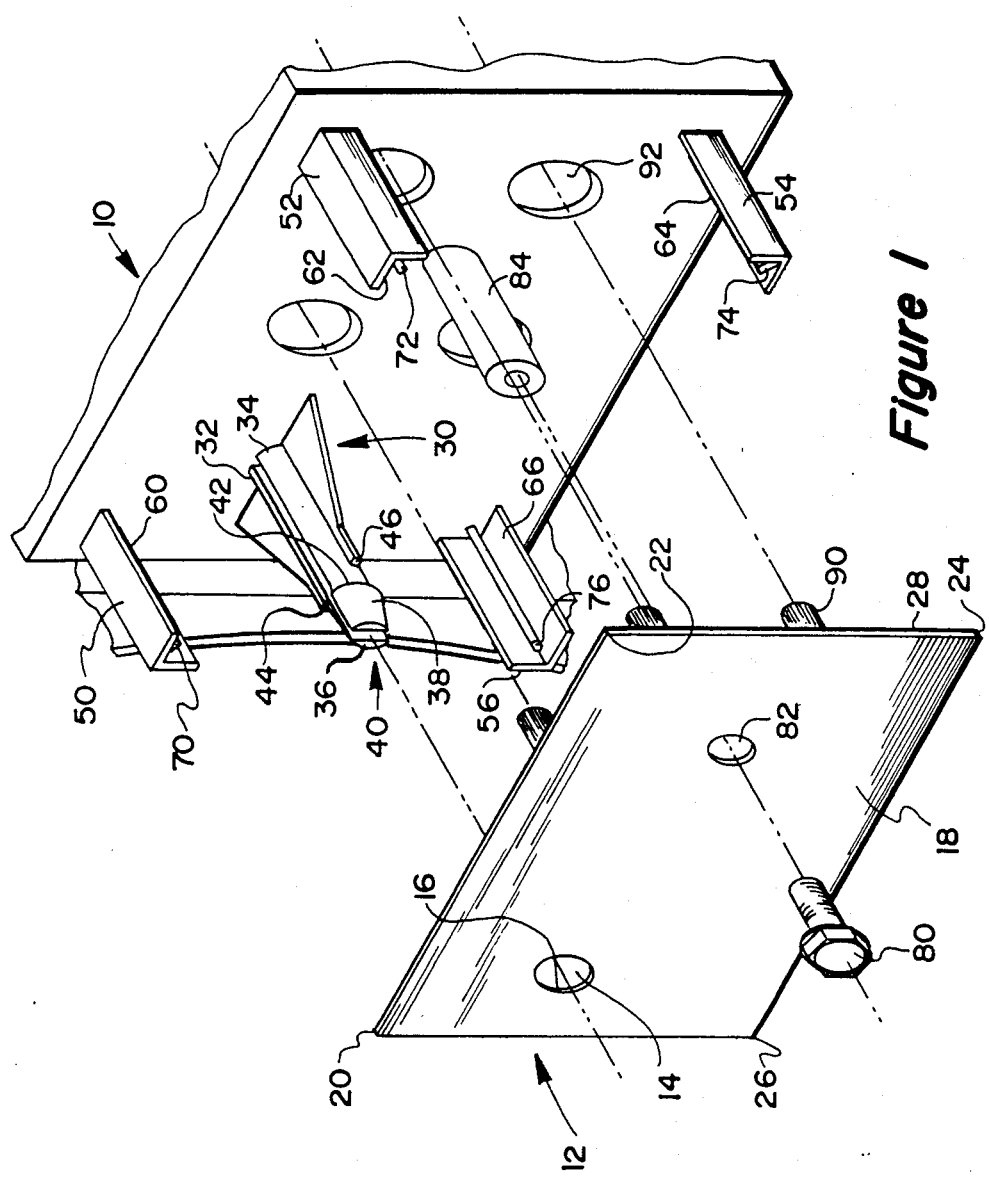
FIG. 1 shows an exploded perspective view of a cut-away portion of the vertical front wall of a TV cabinet having a collapsible retaining pin pursuant to the subject invention; also shown therein are a PCB and a screw for fixedly securing the PCB to the cabinet.
Figure 2:
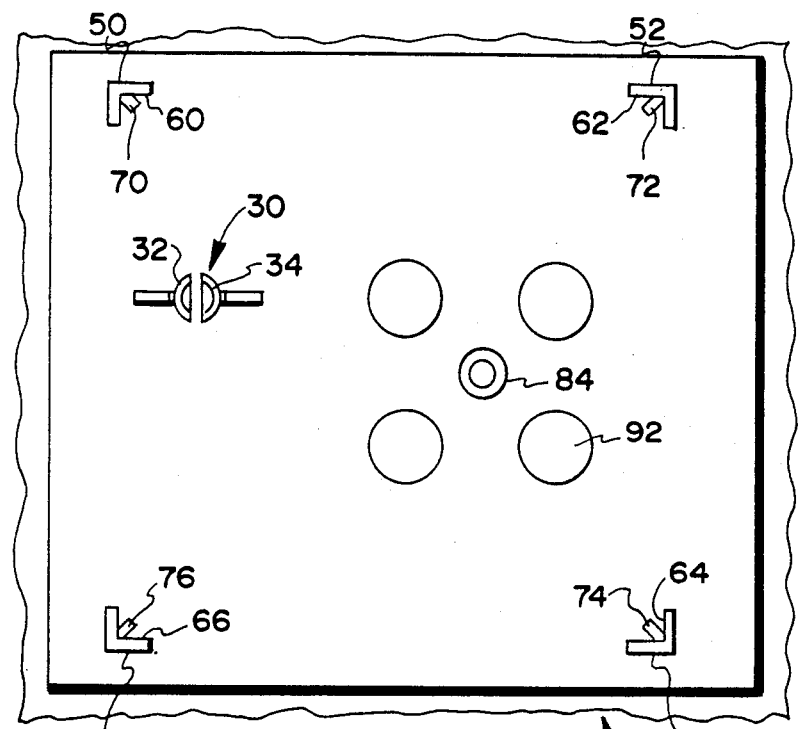
FIGS. 2 and 3 illustrate a rear view and a bottom view of the FIG. 1 cabinet.
Figure 3:
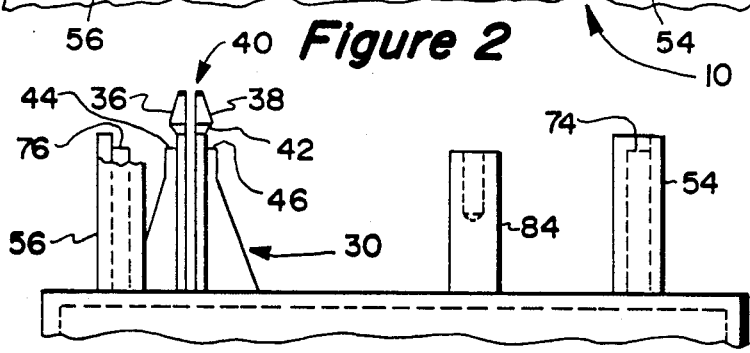

Shown in FIGS. 1-3 is a portion of the vertical front wall of a TV cabinet 10, as seen from the inside of the cabinet. A PCB 12, having a substantially rectangular cross-section, is assembled to the TV cabinet 10 in the manner described hereinbelow. Although the detailed description refers to the assembly of a PCB to a TV cabinet, it will be understood that this invention is also applicable for securing any other component (e.g., speaker assembly, tuner mounting assembly, etc.) to its housing (e.g., VCR, PC, CD player, etc. ).

Integrally-molded with the TV cabinet 10 is a split or collapsible pin 30 pursuant to this invention. The collapsible pin 30 comprises a pair of spaced elements 32 and 34. Both the cabinet 10 and the spaced elements 32 and 34 are made from a suitable plastic material—e.g., high impact polystyrene. The spaced elements 32 and 34 are equipped with respective head portions 36 and 38. The external surfaces of the head portions 36 and 38 form a frusto-conical portion 40 to facilitate insertion thereof into an aperture 14 in the PCB 12.

When the collapsible pin elements 32 and 34 are respectively spaced from each other and in engagement with each other, the head portions 36 and 38 define a first cross-section greater than and a second cross-section smaller than the cross-section of the aperture 14 in the PCB 12. As the PCB 12 is slipped over the collapsible pin 30 at an assembly station 102 (FIG. 4), the peripheral walls 16 of the aperture 14 press together the spaced elements 32 and 34 to allow their passage through the aperture in the PCB. When the outside wall 18 of the PCB 12 clears the inside wall 42 of the frusto-conical portion 40, the spaced elements 32 and 34 spring back to their normal, separated position to temporarily secure the PCB to the cabinet 10 until it is fixedly attached thereto.

Further disposed on the TV cabinet 10 are a set of four nesting members 50, 52, 54 and 56, having an L-shaped cross-section. When the PCB 12 is mounted on the cabinet 10, the inner walls 60, 62, 64 and 66 of the nesting members 50-56 engage the respective corners 20, 22, 24 and 26 of the PCB to assure accurate angular orientation of the PCB relative to the cabinet.

The nesting members 50-56 are each provided with respective ledge portions 70, 72, 74 and 76. Likewise, the spaced elements 32 and 34 are equipped with respective shoulder portions 44 and 46. The ledge portions 70-76 and the shoulder portions 44 and 46 engage the inner wall 28 of the PCB 12 to assure accurate spacing between the PCB and the front wall of the cabinet 10.

Figure 4:
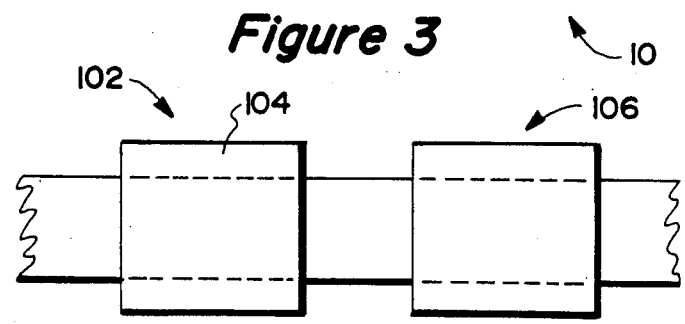
FIG. 4 schematically depicts an automatic instrument line for assembling TV receivers.

FIG. 4 schematically illustrates a portion of an automatic instrument line 100, including the assembly station 102. After temporary capture of the PCB 12, a pallet 104, carrying the partially-assembled PCB and the TV cabinet 10, is advanced to a screw driving station 106.

At the screw driving station 106, a screw 80 is driven through an opening 82 in the PCB 12 into a post 84 provided in the TV cabinet 10. This fixedly secures the PCB 12 to the cabinet 10. Alternately, other suitable means (e.g., glue, heat, staking, rivet, etc.) may be used, instead of a screw, for permanently mounting the PCB 12 to the cabinet 10.

The PCB 12 shown in FIG. 1 is a front auxiliary control (FAC) board. It is provided with manual adjustments, indicated by numeral 90, for brightness, contrast, color and tint, etc. When the PCB 12 is mounted on the TV cabinet 10, the adjustments 90 are accessible through respective openings, indicated by numeral 92, in the front wall of the TV cabinet.

The collapsible pin 30, in accordance with this invention, temporarily captures the PCB 12 to the TV cabinet 10. This arrangement prevents the PCB 12 from misaligning or falling off, as the partially-installed product is advanced to the next work station, where the PCB is finally secured in place.

What is claimed is:

1. A method for fixedly attaching a component to a base member of a cabinet comprising:
   providing said component with an aperture;
   providing said base member with a resiliently collapsible holding member and fixed component aligning means; said collapsible holding member defining from a free end thereof first and second cross-sections which are respectively greater than and smaller than the cross-section of said aperture in said component;

inserting said apertured component against said aligning means and over said free end of said collapsible holding member at a first work station to cause said holding member to contract to allow its passage through said aperture in said component and then to expand for temporarily aligning and securing said component to said base member to prevent said component from dislocating during handling operations prior to its final attachment to said base member;

transporting said base member with said temporarily secured and aligned component to a second work station; and fixedly attaching with a separate fastener said temporarily secured and aligned component to said base member at said second work station.

2. The method defined in claim 1 wherein said step of fixedly attaching said component comprises:

driving a screw through an opening in said component into said base member.

* * * * *